United States Patent [19]
Ueno et al.

[11] Patent Number: 5,107,143
[45] Date of Patent: Apr. 21, 1992

[54] SIGNAL OUTPUT CIRCUIT INCLUDED IN BUS DRIVING INTEGRATED CIRCUIT

[75] Inventors: Masaji Ueno, Chofu; Kumi Ofusa, Yokohama, both of Japan

[73] Assignee: Kabushiki Kaisha Toshiba, Kawasaki, Japan

[21] Appl. No.: 618,957

[22] Filed: Nov. 28, 1990

[30] Foreign Application Priority Data

Nov. 29, 1989 [JP] Japan .................................. 1-307446

[51] Int. Cl.$^5$ .................... H03K 19/20; H03K 19/094
[52] U.S. Cl. .................................... 307/446; 307/451; 307/456; 307/570; 307/473
[58] Field of Search ............... 307/443, 448, 451, 446, 307/570, 555, 473, 270, 303, 455, 456

[56] References Cited
U.S. PATENT DOCUMENTS 4,801,825 1/1989 Stanley et al. ....................... 307/446

Primary Examiner—John S. Heyman
Assistant Examiner—Margaret Rose Wambach
Attorney, Agent, or Firm—Banner, Birch, McKie & Beckett

[57] ABSTRACT

A first Schottky barrier type NPN transistor for pulling up an output signal and a second Schottky barrier type NPN transistor for pulling down an output signal are connected, in a totem pole configuration, between the nodes of power source potential and ground potential, a connecting point of these NPN transistors is connected to an output terminal. A resistor and a Schottky diode are connected in series between the node of the power source potential and the collector of the first NPN transistor. The collector of a third Schottky barrier type NPN transistor for driving the first NPN transistor is connected to a connecting point of the resistor and the Schottky diode, and the emitter of the third NPN transistor is connected to the base of the first NPN transistor. A resistor is connected between the base and emitter of the first NPN transistor.

23 Claims, 3 Drawing Sheets

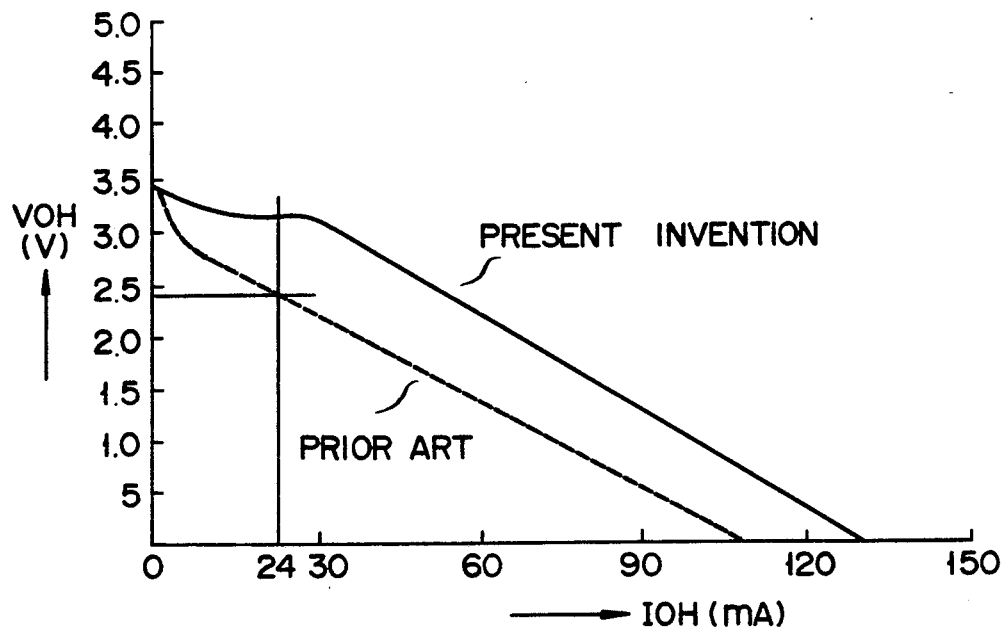
FIG. 4
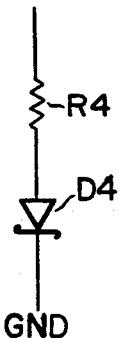 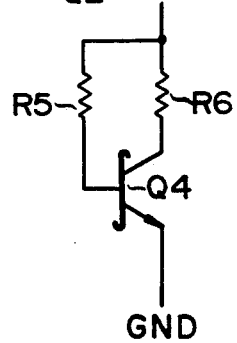 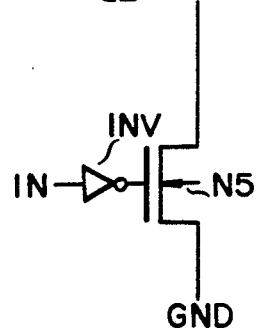
FIG. 5A   FIG. 5B   FIG. 5C

SIGNAL OUTPUT CIRCUIT INCLUDED IN BUS DRIVING INTEGRATED CIRCUIT

BACKGROUND OF THE INVENTION

1. Field of the Invention

The present invention relates to a signal output circuit included in a bus driving integrated circuit (bus driving IC) and, more particularly, to a tristate type Bi-CMOS signal output circuit included in a hybrid Bi-CMOS integrated circuit of a bipolar transistor and a complementary insulating gate field effect transistor.

2. Description of the Related Art

Generally, a plurality of bus driving integrated circuits includes respective tristate type Bi-CMOS signal output circuits, and the output terminals of the signal output circuits are connected in common to a bus line. FIG. 1 shows bus driving integrated circuits 10 each having Bi-MOS signal output circuit 11. The output terminals of signal output circuits 11 are connected in common to bus line 12. Each of circuits 11 outputs a signal which is high or low in transistor-transistor-logic (TTL) level and its output is rendered in a high-impedance state, and causes a CMOS transistor to make a bipolar transistor at an output stage conductive.

FIG. 2 illustrates a conventional tristate type signal output circuit comprising bipolar output stage 31 and MOS output drive control circuit 32.

In bipolar output stage 31, NPN transistor Q1 for pulling up an output signal and Schottky barrier type NPN transistor Q2 for pulling down an output signal are connected, in a totem pole configuration, between a node of power supply potential VCC and that of ground potential GND, and the connecting point of NPN transistors Q1 and Q2 is connected to output terminal 33. Schottky diode D1 and resistor R1 are connected in series between the node of power supply potential VCC and the collector of NPN transistor Q1. The collector and base of NPN transistor Q1 are connected to the collector and emitter of NPN transistor Q3, respectively, and NPN transistors Q1 and Q3 are Darlington-connected. Resistor R2 is connected between the base and emitter of NPN transistor Q1.

In MOS output drive control circuit 32, P-channel MOS transistor P1, resistor R3, N-channel MOS transistors N1 and N2, and pull-down circuit PD are connected in series between the node of power supply potential VCC and ground GND, N-channel MOS transistor N3 is connected between the base of NPN transistor Q1 and ground GND, and N-channel MOS transistor N4 is connected between the base of transistor Q2 and ground GND. The gate of N-channel transistor N1 is supplied with input signal IN, the gate of N-channel transistor N2 is supplied with output enable signal EN, and the gates of P-channel transistor P1, N-channel transistor N3, and N-channel transistor N4 are supplied with inverted signal $\overline{EN}$ of output enable signal EN. The connecting point of resistor R3 and N-channel transistor N1 is connected to the base of NPN transistor Q3, and the connecting point of N-channel transistor N2 and pull-down circuit PD is connected to the base of NPN transistor Q2.

Schottky diode D2 is connected between the base of NPN transistor Q1 and the drain of N-channel transistor N1, and Schottky diode D3 is connected between output terminal 33 and the drain of N-channel transistor N1.

An operation of the foregoing signal output circuit will be described.

When output enable signal EN is at a high level and inverted signal $\overline{EN}$ is at a low level, P-channel transistor P1 and N-channel transistor N2 are turned on and N-channel transistors N3 and N4 are turned off. The signal output circuit thus becomes active.

In this active state, when input signal IN is low in CMOS level, N-channel transistor N1 is turned off. NPN transistor Q3 is thus supplied with a base current from the node of power supply potential VCC through P-channel transistor P1 and resistor R3 and turned on. NPN transistor Q1 is also turned on. NPN transistor Q2 is turned off by discharging electric charges from its base by pull-down circuit PD. A current thus flows from the node of power supply potential VCC to output terminal 33 through Schottky diode D1, resistor R1 and NPN transistor Q1, and thus output signal OUT is set high in TTL level. Since diodes D2 and D3 are then in an off-state, they do not adversely affect a circuit operation.

If input signal IN is high in CMOS level, N-channel transistor N1 is turned on. NPN transistor Q2 is thus supplied with a base current from the node of power supply potential VCC through P-channel transistor P1 and N-channel transistors N1 and N2, and supplied with a base current from output terminal 33 through diode D3 and N-channel transistors N1 and N2. NPN transistor Q2 is therefore turned on. If N-channel transistor N1 is turned on, electric charges are pulled out from the base of N-channel transistor Q3 through N-channel transistors N1 and N2 and pull-down circuit PD, and NPN transistor Q3 is turned off. NPN transistor Q1 is turned off by discharging electric charges from its base by diode D2. The potentials of both ends of resistor R2 are equalized by diodes D2 and D3 and thus transistor Q1 is reliably turned off. The charges of output terminal 33 are supplied to the ground through NPN transistor Q2 and output signal OUT is set at zero in TTL level.

On the contrary, when output enable signal EN is at a low level and its inverted signal $\overline{EN}$ is at a high level, N-channel transistors N1 and N2 are turned off and N-channel transistors N3 and N4 are turned on. The signal output circuit thus becomes inactive. In other words, NPN transistor Q3, NPN transistor Q1 for pulling up an output signal, and NPN transistor Q2 for pulling down an output signal are turned off, resulting in a high-impedance output state.

Schottky diode D1 is inserted in the signal output circuit shown in FIG. 2 for the following reason.

When the output terminals of a plurality of bus driving integrated circuits each including the signal output circuit shown in FIG. 2 are connected to a common bus line as illustrated in FIG. 1, some of the bus driving integrated circuits are selectively rendered in a non-operating state. Power supply potential VCC is not applied to VCC power supply lines of signal output circuits of the integrated circuits in the non-operating state. Since signals are supplied from the other integrated circuits in an operating state to the bus line, a current may flow from the bus line to the node of power supply potential VCC through output terminal 33, resistor R2, the base and collector of NPN transistor Q1 and resistor R1 in the integrated circuits in the nonoperating state. The current path is however cut off by Schottky diode D1 and therefore the current does not adversely affect the signals on the bus line.

If Schottky diode D1 and resistor R1 are inserted in the signal output circuit as shown in FIG. 2, the collector voltage of NPN transistor Q3 is lowered more than the base voltage thereof by dropping the voltages of diode D1 and resistor R1 when a high-level signal is output from terminal 33. The capability of outputting a current from NPN transistor Q1 is thus reduced, and static characteristics of output current and output voltage are deteriorated. For example, if output current of 24 mA is desired when VCC is 5 V, an output voltage is made much lower than a prescribed voltage.

SUMMARY OF THE INVENTION

The present invention has been made in order to resolve the above problem of the prior art and accordingly an object of the invention is to provide a signal output circuit which improves in capability of outputting a current when a high-level signal is output, without degrading an alternating output characteristic.

According to the present invention, there is provided a signal output circuit comprising:

first and second nodes to which first and second power supply potentials having different values are applied;

an output terminal for generating an output signal;

first load means one end of which is connected to the first node;

a first bipolar transistor of a Schottky type whose base is supplied with a first signal and collector is connected to the other end of the first load means;

a Schottky diode whose anode is connected to the other end of the first load means;

a second bipolar transistor of a Schottky type whose collector is connected to a cathode of the Schottky diode, base is connected to the emitter of the first bipolar transistor, and emitter is connected to the output terminal;

a resistor connected between the base and emitter of the second bipolar transistor;

a third bipolar transistor of a Schottky type whose base is supplied with a second signal, collector is connected to the output terminal, emitter is connected to the second node; and a MOS output drive control circuit for receiving an output drive control signal and an input signal to form the first and second signals, thereby switching the first and third bipolar transistors or turning off the first and third bipolar transistors.

BRIEF DESCRIPTION OF THE DRAWINGS

FIG. 4 is a graph showing a static output characteristic of the signal output circuit shown in FIG. 3; and FIGS. 5A to 5C are circuit diagrams specifically showing parts of the signal output circuit shown in FIG. 3.

DETAILED DESCRIPTION OF THE PREFERRED EMBODIMENT

An embodiment of the present invention will be described with reference to the accompanying drawings.

Figure 1:
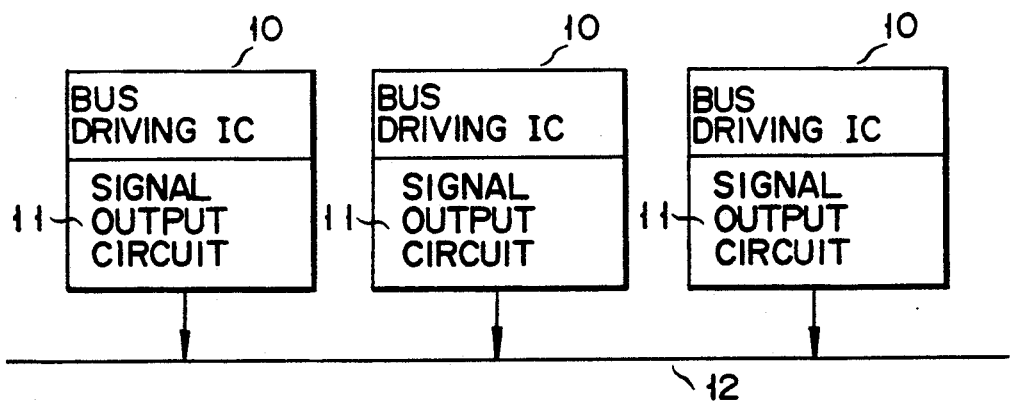
FIG. 1 is a block diagram showing an integrated circuit system in which a plurality of bus driving integrated circuits is arranged.
Figure 2:
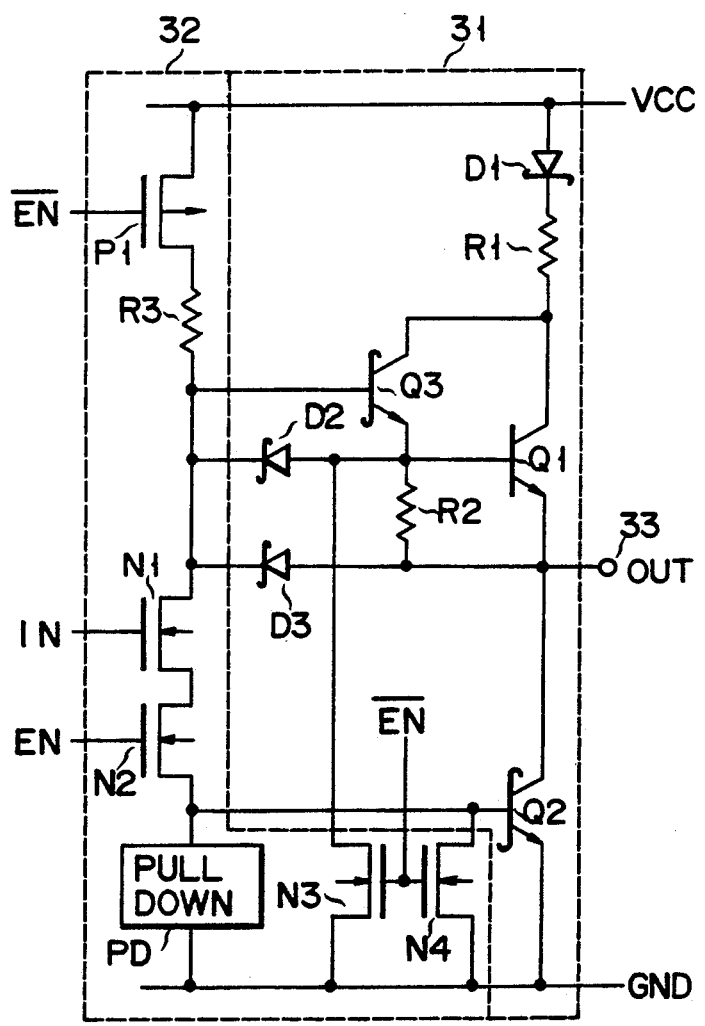
FIG. 2 is a circuit diagram showing a conventional signal output circuit.
Figure 3:
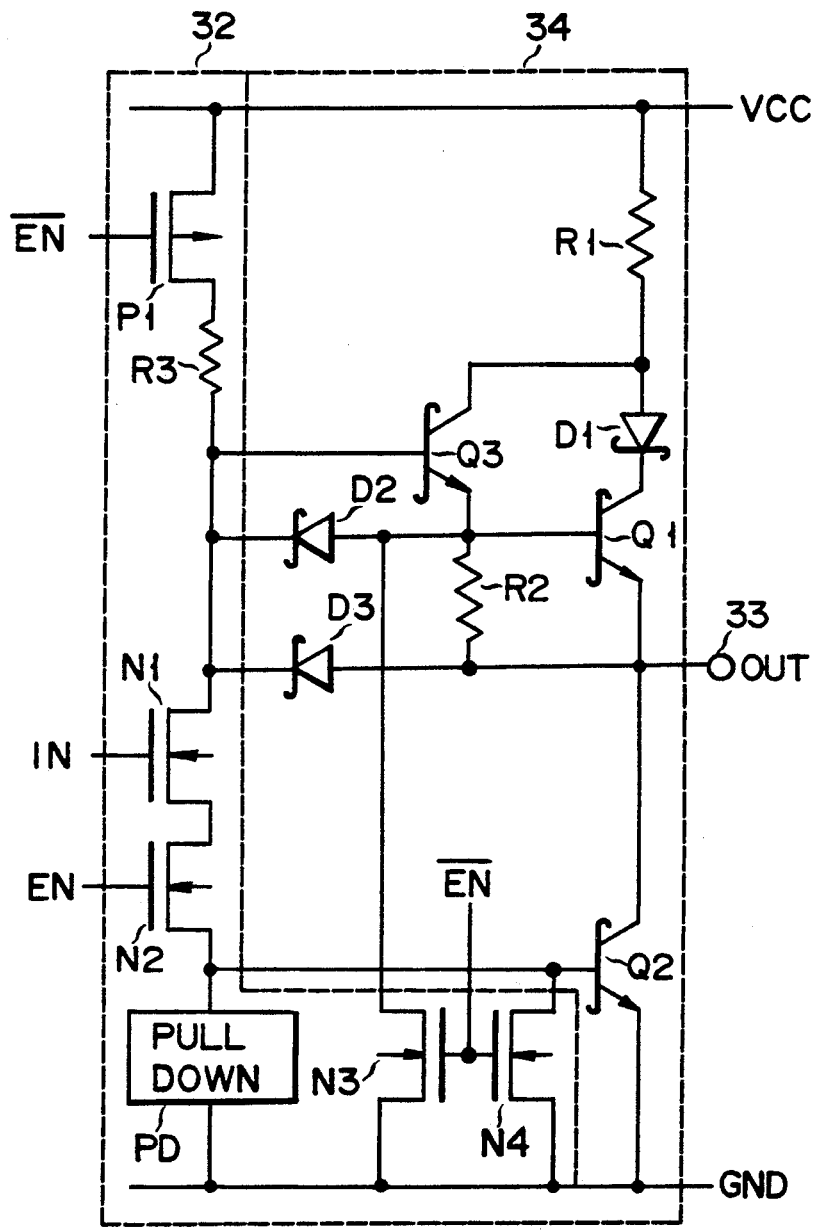
FIG. 3 is a circuit diagram showing a signal output circuit according to an embodiment of the present invention.

FIG. 3 illustrates a tristate type Bi-CMOS signal output circuit formed in a bus driving integrated circuit, which comprises bipolar output stage 34 and MOS output drive control circuit 32. The signal output circuit differs from the conventional signal output circuit shown in FIG. 2 only in the connecting point of resistor R1 and Schottky diode D1 in output stage 34 and in the use of a Schottky barrier type transistor in place of NPN transistor Q1. The descriptions of the structural elements shown in FIG. 3 denoted by the same numerals as those in FIG. 2 are therefore omitted.

In bipolar output stage 34, one end of resistor R1 is connected to a node of power supply potential VCC. An anode of Schottky diode D1 is connected to the other end of resistor R1. The collector of Schottky barrier type NPN transistor Q1 for pulling up an output signal is connected to a cathode of Schottky diode D1. The emitter of NPN transistor Q1 is connected to output terminal 33. The collector of Schottky barrier type NPN transistor Q2 for pulling down an output signal is connected to output terminal 33, the emitter thereof is connected to a node of ground potential GND.

The collector and emitter of Schottky type NPN transistor Q3 are connected to the other end of resistor R1 and the base of NPN transistor Q1, respectively. Resistor R2 is connected between the base and emitter of NPN transistor Q1.

In MOS output drive control circuit 32, P-channel MOS transistor P1, resistor R3, N-channel MOS transistors N1 and N2, and pull-down circuit PD are connected in series between the nodes of power supply potential VCC and ground potential GND, N-channel MOS transistor N3 is connected between the base of NPN transistor Q1 and ground GND, and N-channel MOS transistor N4 is connected between the base of NPN transistor Q2 and the ground GND. Input signal IN is supplied to the gate of N-channel transistor N1, output enable signal EN is supplied to the gate of N-channel transistor N2, and inverted signal $\overline{EN}$ of output enable signal EN is supplied to the gates of P-channel transistor P1, N-channel transistor N3 and N-channel transistor N4. The connecting point of resistor R3 and N-channel transistor N1 is connected to the base of NPN transistor Q3, the connecting point of N-channel transistor N2 and pull-down circuit PD is connected to the base of NPN transistor Q2.

Schottky diode D2 is connected between the base of NPN transistor Q1 and the drain of N-channel transistor N1, and Schottky diode D3 is connected between output terminal 33 and the drain of N-channel transistor N1.

An operation of the signal output circuit will be described.

When output enable signal EN is high in level and inverted signal $\overline{EN}$ is low in level, P- and N-channel transistors P1 and N2 are turned on, and N-channel transistors N3 and N4 are turned off. The output circuit is thus rendered in an active state.

In this active state, when input signal IN is low in CMOS level, N-channel transistor N1 is turned off. A base current flows from the node of power source potential VCC into NPN transistor Q3 through P-channel transistor P1 and resistor R3, accordingly NPN transistor Q3 is turned on and NPN transistor Q1 for pulling up the output signal is turned on. On the other hand, electric charges are discharged from the base of NPN transistor Q2 by pull-down circuit PD and thus NPN transistor Q2 for pulling down the output signal is turned off. A current thus flows from the node of power supply potential VCC to output terminal 33 through resistor R1, Schottky diode D1, and NPN transistor Q1, and output signal OUT becomes high in TTL level. Since diodes D2 and D3 are then in an off-state, they do not adversely affect the circuit operation.

When input signal IN is high in CMOS level, N-channel transistor N1 is turned on. NPN transistor Q2 for pulling down the output signal is thus supplied with a base current from the node of power supply potential VCC through P-channel transistor P1, resistor R3, and N-channel transistors N1 and N2, and also supplied with the base current from output terminal 3 through diode D3 and N-channel transistors N1 and N2. NPN transistor Q2 is therefore turned on. If N-channel transistor N1 is turned on, NPN transistor Q3 is turned off by discharging electric charges from its base by N-channel transistors N1 and N2 and pull-down circuit PD, and NPN transistor Q1 is also turned off by discharging the electric charges from its base by diode D2. Since the potentials at both ends of resistor R2 are equalized to each other by diode D3, transistor Q1 is reliably turned off. The charges of output terminal 33 are thus supplied to the ground through NPN transistor Q2, and output signal OUT becomes zero in TTL level.

Contrary to the above, when output enable signal EN is low in level and its inverted signal $\overline{EN}$ is high in level, N-channel transistors N1 and N2 are turned off and N-channel transistors N3 and N4 are turned on. The signal output circuit thus becomes inactive. NPN transistor Q3, NPN transistor Q1 for pulling up the output signal, and NPN transistor Q2 for pulling down the output signal are turned off, resulting in a high impedance output state. In this state, the operation of the signal output circuit is virtually the same as that of the conventional circuit shown in FIG. 2.

In the high-level signal outputting time when NPN transistor Q3 is driven by MOS output drive control circuit 32 to turn on NPN transistor Q1, even though a voltage drop occurs in resistor R1 and Schottky diode D1, a voltage, which is higher than the conventional voltage by the dropped voltage of Schottky diode D1, is applied to the collector of NPN transistor Q3.

In the embodiment described above, voltage VCE1 between the collector and emitter of NPN transistor Q1 may be lower than that of the prior art, as a voltage drop occurs in Schottky diode D1. Since, however, the signal output circuit according to the embodiment comprises a Schottky barrier type bipolar transistor which can be operated in a shallow saturated region as NPN transistor Q1, it has the following advantages.

If a voltage between the base and emitter of NPN transistor Q1 and a voltage between the collector and emitter of NPN transistor Q3 are represented by VBE1 and VCE3, respectively, the following relationship is obtained.

$$VCE1 = VBE1 + VCE3 - VF \quad (1)$$

The size of an element is thus set so that VBE1 is larger than VF and, more specifically, VCE1 can be ensured by increasing the size of, for example, Schottky diode D1.

The output current capability of NPN transistor Q1 can thus be prevented from reducing and the static characteristics of output current and output voltage can be prevented from deteriorating. Further, no influence is exercised on the alternating output characteristic of the signal output circuit.

FIG. 4 is a graph showing the relationship between output current IOH and output voltage VOH when power supply potential VCC is 5 V. In this figure, the solid line indicates the relationship of the present invention and the dotted line represents that of the prior art shown in FIG. 2. According to the circuit of the above embodiment of the present invention, when output current IOH is set at 24 mA, output voltage VOH greatly exceeds 2.4 V which is the minimum prescribed value.

FIGS. 5A to 5C illustrate specific arrangements of pull-down circuit PD.

The pull-down circuit illustrated in FIG. 5A comprises resistor R4 one end of which is connected to the base of NPN transistor Q2, and Schottky diode D4 whose anode is connected to the other end of resistor R4 and cathode is connected to the node of ground GND.

The pull-down circuit illustrated in FIG. 5B comprises resistors R5 and R6 one end of each of which is connected to the base of NPN transistor Q2, and Schottky barrier type NPN transistor Q4 whose base is connected to the other end of resistor R5, collector is connected to the other end of resistor R6, and emitter is connected to the node of ground GND.

The pull-down circuit illustrated in FIG. 5C comprises N-channel MOS transistor N5 whose source and drain are connected between the base of NPN transistor Q2 and the node of ground GND, and inverter INV whose output terminal is connected to the gate of MOS transistor N5 and which is supplied with input signal IN.

What is claimed is:

1. A signal output circuit comprising:
   first and second nodes to which first and second power supply potentials having different values are applied;
   an output terminal for generating an output signal;
   first load means one end of which is connected to said first node;
   a first bipolar transistor of a Schottky type whose base is supplied with a first signal and collector is connected to the other end of said first load means;
   a Schottky diode whose anode is connected to the other end of said first load means;
   a second bipolar transistor of a Schottky type whose collector is connected to a cathode of said Schottky diode, base is connected to the emitter of said first bipolar transistor, and emitter is connected to said output terminal;
   a resistor connected between the base and emitter of said second bipolar transistor;
   a third bipolar transistor of a Schottky type whose base is supplied with a second signal, collector is connected to said output terminal, emitter is connected to said second node; and
   a MOS output drive control circuit for receiving an output drive control signal and an input signal to form the first and second signals, thereby switching said first and third bipolar transistors or turning off said first and third bipolar transistors.

2. The signal output circuit according to claim 1, wherein said first, second and third bipolar transistors are NPN transistors.

3. The signal output circuit according to claim 1, wherein said MOS output drive control circuit comprises:

a first MOS transistor of a first polarity whose source is connected to a first node and gate is supplied with the output drive control signal;

second load means one end of which is connected to a drain of said first MOS transistor and the other end of which is connected to the base of said first bipolar transistor;

a second MOS transistor of a second polarity whose drain is connected to the other end of said second load means and gate is supplied with said input signal;

a third MOS transistor of the second polarity whose drain is connected to a source of said second MOS transistor, source is connected to the base of said third bipolar transistor, and gate is supplied with a signal having a level which is complementary to that of said output drive control signal;

a fourth MOS transistor of the second polarity whose drain is connected to the base of said second bipolar transistor, source is connected to said second node, and gate is supplied with said output drive control signal; and a fifth MOS transistor of the second polarity whose drain is connected to the base of said third bipolar transistor, source is connected to said second node, and gate is supplied with said output drive control signal.

4. An integrated circuit system comprising:

a plurality of bus driving integrated circuits each having a signal output circuit which comprises: first and second nodes to which first and second power supply potentials having different values are applied; an output terminal for generating an output signal; load means one end of which is connected to said first node; a first bipolar transistor of a Schottky type whose base is supplied with a first input signal and collector is connected to the other end of said load means; a Schottky diode whose anode is connected to the other end of said load means; a second bipolar transistor of a Schottky type whose collector is connected to a cathode of said Schottky diode, base is connected to the emitter of said first bipolar transistor, and emitter is connected to said output terminal; a resistor connected between the base and emitter of said second bipolar transistor; a third bipolar transistor of a Schottky type whose base is supplied with a second input signal, collector is connected to said output terminal, emitter is connected to said second node; and a MOS output drive control circuit for receiving an output drive control signal and an input signal to switching said first and third bipolar transistors or turning off said first and third bipolar transistors; and a bus line connected in common to output terminals of the signal output circuits of said plurality of bus driving integrated circuits.

5. The integrated circuit system according to claim 4, wherein said first, second and third bipolar transistors are NPN transistors.

6. The integrated circuit system according to claim 4, wherein said MOS output drive control circuit comprises:

a first MOS transistor of a first polarity whose source is connected to a first node and gate is supplied with the output drive control signal;

second load means one end of which is connected to a drain of said first MOS transistor and the other end of which is connected to the base of said first bipolar transistor;

a second MOS transistor of a second polarity whose drain is connected to the other end of said second load means and gate is supplied with said input signal;

a third MOS transistor of the second polarity whose drain is connected to a source of said second MOS transistor, source is connected to the base of said third bipolar transistor, and gate is supplied with a signal having a level which is complementary to that of said output drive control signal;

a fourth MOS transistor of the second polarity whose drain is connected to the base of said second bipolar transistor, source is connected to said second node, and gate is supplied with said output drive control signal; and a fifth MOS transistor of the second polarity whose drain is connected to the base of said third bipolar transistor, source is connected to said second node, and gate is supplied with said output drive control signal.

7. A signal output circuit comprising:

an output terminal for outputting a signal;

a load having a first terminal connected to a power supply;

an npn bipolar transistor whose base is supplied with a first control signal and collector is connected to a second terminal of said load;

a diode having an anode connected to the second terminal of said load;

means for pulling up the output signal at said output terminal, said means for pulling up having current terminals coupled between a cathode of said diode and said output terminal and having a control terminal connected to an emitter of said npn bipolar transistor;

means for pulling down the output signal at said output terminal, said means for pulling down having current terminals coupled between said output terminal and a reference potential and having a control terminal receiving a second control signal; and an output drive control circuit receiving an input signal and a drive signal and producing the first and second control signals to drive said npn bipolar transistor and said means for pulling down.

8. A signal output circuit according to claim 7, wherein said means for pulling up comprises an npn bipolar transistor whose collector is connected to said cathode of the diode, whose base is connected to the emitter of said npn bipolar transistor, and whose emitter is connected to said output terminal.

9. A signal output circuit according to claim 7, wherein said means for pulling down comprises an npn bipolar transistor whose collector is connected to said output terminal, whose base is connected to said output drive circuit, and whose emitter is grounded.

10. A signal output circuit according to claim 9 wherein said output drive circuit is a MOS output drive circuit that switches ON and OFF said npn bipolar transistor and said npn bipolar transistor of said means for pulling down.

11. A signal output circuit according to claim 7, wherein said output drive circuit is a MOS output drive circuit.

12. A signal output circuit according to claim 7, wherein said npn bipolar transistor is an npn Schottky transistor.

13. A signal output circuit according to claim 7, wherein said diode is a Schottky diode.

14. A bus driving system comprising:
 a bus line;
 an integrated circuit; and
 a signal output circuit for outputting signals from said integrated circuit to said bus line, said signal output circuit comprising:
 an output terminal for outputting a signal;
 a load having a first terminal connected to a power supply;
 an npn bipolar transistor whose base is supplied with a first control signal and collector is connected to a second terminal of said load;
 a diode having an anode connected to the second terminal of said load;
 means for pulling up the output signal at said output terminal, said means for pulling up having current terminals coupled between a cathode of said diode and said output terminal and having a control terminal connected to an emitter of said npn bipolar transistor;
 means for pulling down the output signal at said output terminal, said means for pulling down having current terminals coupled between said output terminal and a reference potential and having a control terminal receiving a second control signal; and
 an output drive control circuit receiving an input signal and a drive signal and producing the first and second control signals to drive said npn bipolar transistor and said means for pulling down.

15. A bus driving system according to claim 14, wherein said means for pulling up comprises a npn bipolar transistor whose collector is connected to said cathode of the diode, whose base is connected to the emitter of said npn bipolar transistor, and whose emitter is connected to said output terminal.

16. A bus driving system according to claim 14, wherein said means for pulling down comprises a npn bipolar transistor whose collector is connected to said output terminal, whose base is connected to said output drive circuit, and whose emitter is grounded.

17. A bus driving system according to claim 16, wherein said output drive circuit is a MOS output drive circuit that switches ON and OFF said npn bipolar transistor and said npn bipolar transistor of said means for pulling down.

18. A bus driving system according to claim 14, wherein said output drive circuit is a MOS output drive circuit.

19. A bus driving system according to claim 14 further comprising a plurality of bus driving integrated circuits each connected to said bus line.

20. A bus driving system according to claim 19 wherein each of the plurality of bus driving integrated circuits include a signal output circuit.

21. A signal output circuit according to claim 14, wherein said npn bipolar transistor is an npn Schottky transistor.

22. A signal output circuit according to claim 14, wherein said diode is a Schottky diode.

23. A signal output circuit, comprising:
 an output terminal for outputting an output signal;
 a first resistor having a first terminal coupled to a power supply line;
 a Schottky diode having an anode coupled to a second terminal of said first resistor;
 a first npn Schottky transistor having a base receiving a first control signal, a collector coupled to a point between the anode of said Schottky diode and the second terminal of said first resistor, and an emitter;
 a second npn Schottky transistor for pulling up said output signal and having a collector connected to a cathode of said Schottky diode, a base coupled to the emitter of said first npn Schottky transistor, and an emitter coupled to said output terminal;
 a second resistor having a first terminal coupled to the emitter of said second npn Schottky transistor and a second terminal coupled to the base of said second npn Schottky transistor;
 a third npn Schottky transistor for pulling down the output signal and having a base receiving a second control signal, a collector coupled to said output terminal, and an emitter coupled to a ground line; and
 a driving circuit receiving an input signal and a drive signal from said integrated circuit and producing the first and second control signals to drive the first and third Schottky transistors and thereby generate a corresponding output signal.

* * * * *